United States Patent [19]

Ippolito et al.

[11] Patent Number: 5,249,288
[45] Date of Patent: Sep. 28, 1993

[54] PROCESS FOR ACCOMMODATING BAD DISK PAGES IN AN ELECTRONIC PRINTING SYSTEM

[75] Inventors: Ronald A. Ippolito, Rochester; Kitty Sathi, Pittsford, both of N.Y.

[73] Assignee: Xerox Corporation, Stamford, Conn.

[21] Appl. No.: 678,091

[22] Filed: Apr. 1, 1991

[51] Int. Cl.$^5$ .............................................. G06F 11/00
[52] U.S. Cl. .................................. 395/575; 364/245.3; 364/268.5; 364/269.2; 364/944; 364/970.1; 364/DIG. 1; 364/DIG. 2; 371/10.2; 355/205
[58] Field of Search ................. 371/10.1, 10.2; 395/575; 364/236.2, 243, 245.3, 268.5, 268.9, 269.2, 944, 970.1; 355/205

[56] References Cited

U.S. PATENT DOCUMENTS

| | | | |
|---|---|---|---|
| T924,005 | 7/1974 | Coleman, Jr. | 340/172.5 |
| 3,771,143 | 11/1973 | Taylor | 364/DIG. 1 |
| 4,434,487 | 2/1984 | Rubinson et al. | 371/10.2 |
| 4,598,357 | 7/1986 | Swenson et al. | 364/DIG. 1 |
| 4,903,198 | 2/1990 | Iwasaki | 364/DIG. 1 |
| 4,937,864 | 6/1990 | Caseiras et al. | 380/4 |
| 5,086,502 | 2/1992 | Malcolm | 395/575 |
| 5,101,485 | 3/1992 | Perazzoli, Jr. | 395/400 |
| 5,111,444 | 5/1992 | Fukushima et al. | 369/58 |

FOREIGN PATENT DOCUMENTS

| | | |
|---|---|---|
| 0416968A2 | 3/1991 | European Pat. Off. |
| 63-251965 | 10/1988 | Japan . |
| 1436332 | 5/1976 | United Kingdom . |

Primary Examiner—Charles E. Atkinson
Attorney, Agent, or Firm—Frederick E. McMullen

[57] ABSTRACT

An electronic printing system with plural hard disks for storing system files, each disk having a bad page table, from the individual disk bad page tables, generating a composite bad page table, providing a common allocation table for controlling allocation of disk file space for storing system files on the disks, and precluding allocating of system files to areas of the disks identified in the composite bad page table as being unusable.

10 Claims, 13 Drawing Sheets

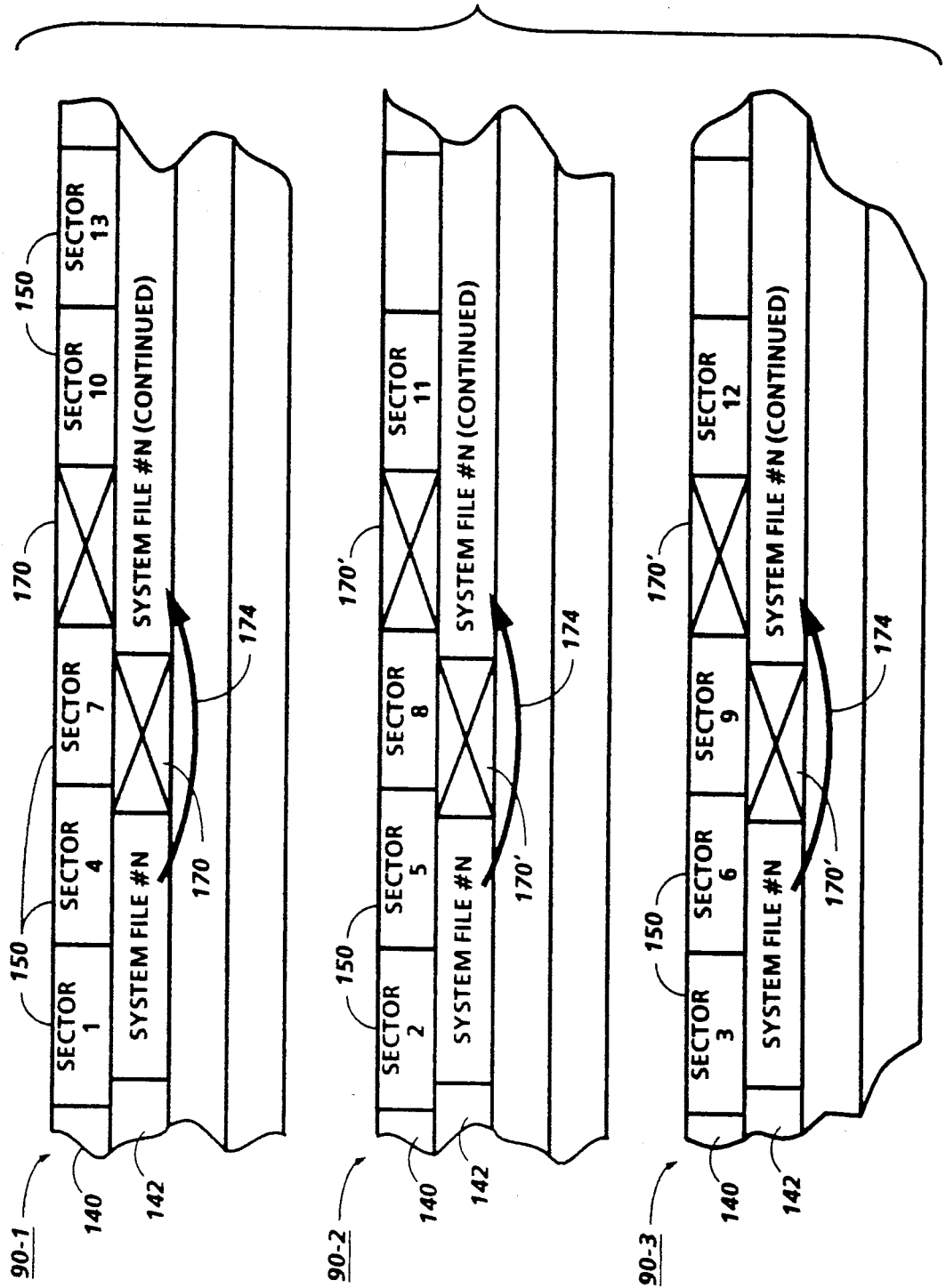

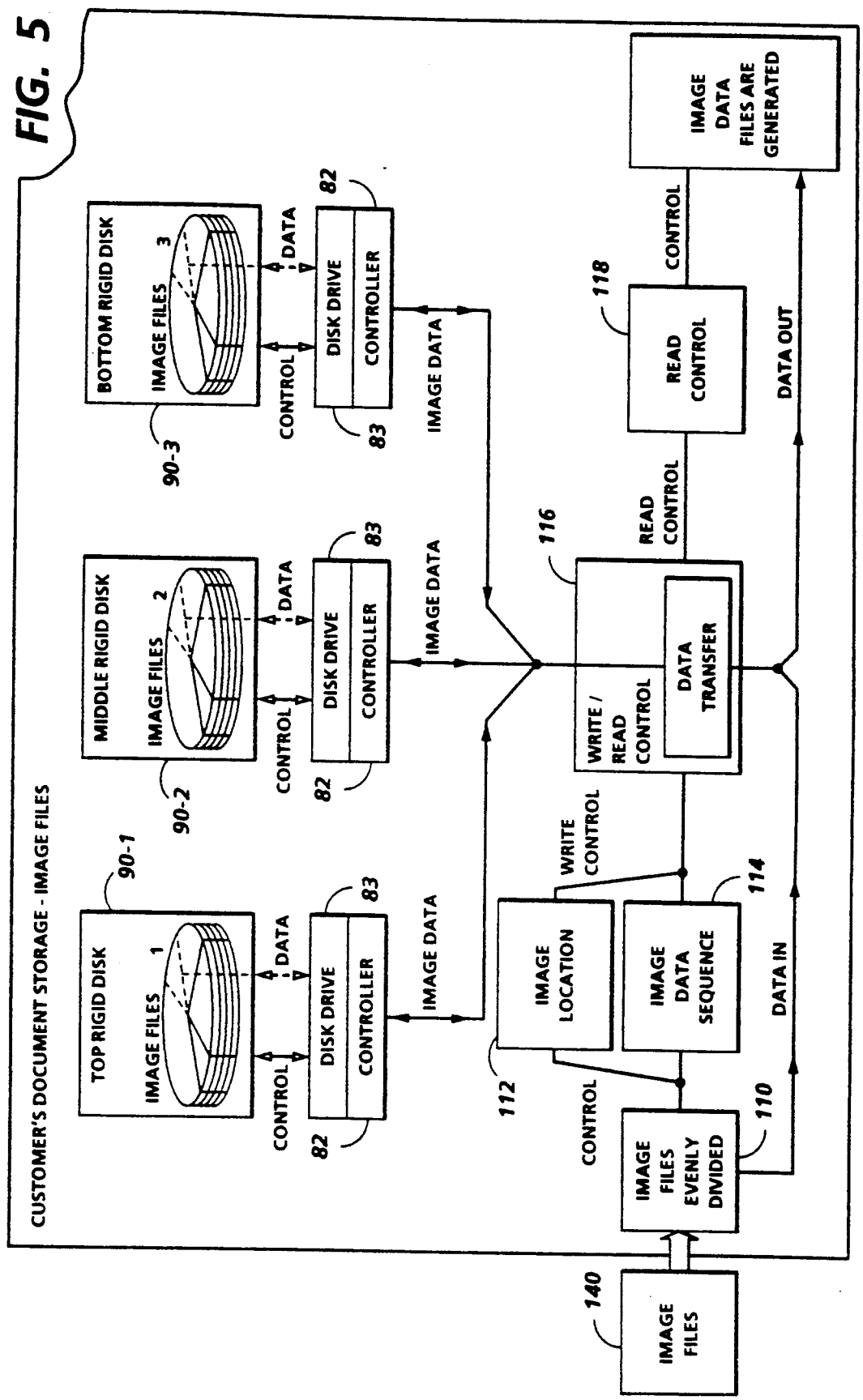

PROCESS FOR ACCOMMODATING BAD DISK PAGES IN AN ELECTRONIC PRINTING SYSTEM

The present application is related to the following co-pending applications, which are assigned to the same assignee as is the present application and incorporated by reference herein: U.S. patent application Ser. No. 07/678,922, filed Apr. 1, 1991 to Mark A. Smith et al to "Process For Replacing Non-Volatile Memory in Electronic Printing Systems"; U.S. patent application Ser. No. 07/678,924, filed Apr. 1, 1991 to Kitty Sathi et al to "Process For Upgrading Software In An Electronic Printing System"; U.S. patent application Ser. No. 07/678,925, filed Apr. 1, 1991 to Christopher Comparetta et al to "A Process For Replacing Storage Media in Electronic Printing Systems"; U.S. patent application Ser. No. 07/678,926, filed Apr. 1, 1991 to Kitty Sathi et al to "File Storage Process For Electronic Printing Systems Having Multiple Disks"; and U.S. patent application Ser. No. 07/678,508, filed Apr. 1, 1991, to Robert J. Slomcenski, et al. to "File Updating Process For Electronic Printing Systems".

The invention relates to electronic printers and printing systems, and more particularly, to a process for accommodating bad disk pages in an electronic printing system.

An important task of the operating system in an electronic printing system is the maintenance of files which are permanent objects recorded on backing storage such as hard disks. Files, which consist of a sequence of pages, comprise system files and image files. The file system provides the operating system with facilities for creating, organizing, reading, writing, modifying, copying, moving, deleting, and controlling access to the files.

Hard disks typically have defective areas, referred to as flawed pages herein, which cannot be used. Each disk comes with a list identifying the location of all flawed pages on the disk. A Volume Allocation Table (VAT) is used to keep track of space allocated to each file stored on the disk. In super disk systems wherein parts of a file are spread over all of the disks, provision of a VAT for each disk uses up substantially more memory and disk resources than if a single VAT could be used. However, use of a common VAT is complicated since the location and number of bad pages for each individual disk varies. Further, if separate VATs were used, redundant copies of the allocation table would not be available.

While it is known in the prior art to store the operating software for a reproduction machine on a hard disk, as shown in U.S. Pat. No. 4,937,864 to Caseiras et al, there is no disclosure to a process for storing files of an electronic printing system for use in operating the printing system following booting of the printing system to an operating state, the system having multiple disks for storing the files, the files including system files replicated on each of the disks and image files that are divided into image file segments with each image file segment stored on a different one of the disks, each of the disks having a bad page table identifying unusable areas of the disk, comprising the steps of: providing an allocation table for controlling allocation of disk file space for storing the files on the disks; combining the bad page table for each of the disks to generate a composite bad page table in which for each bad page on one disk, the same page on each other disk of the multiple disks is also identified as an unusable area; and precluding allocating the files by the allocation table to areas of the disks identified in the composite bad page table as being unusable.

IN THE DRAWINGS

Figure 1:
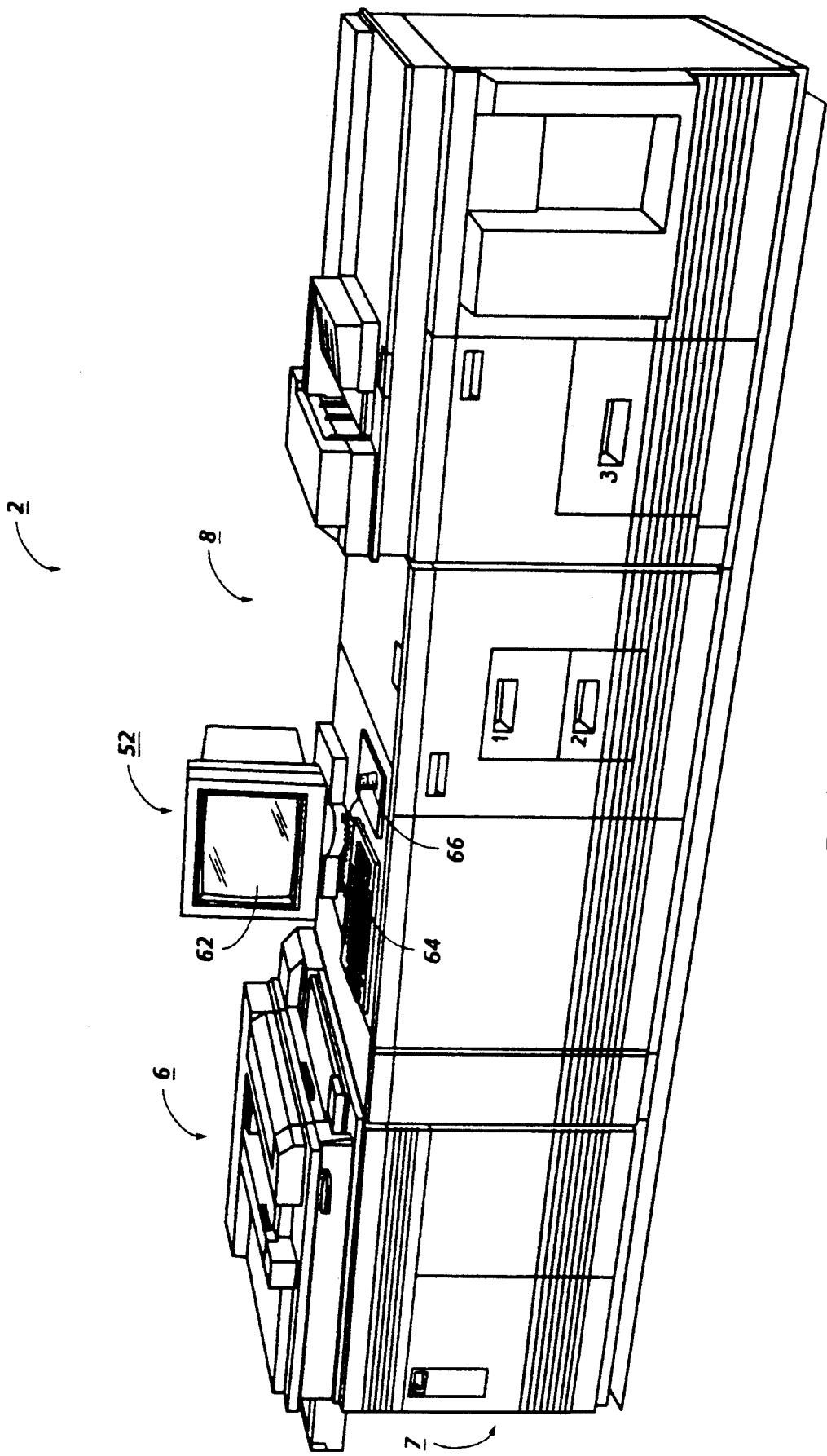
FIG. 1 is a view depicting an electronic printing system incorporating the storage media replacing process of the present invention.
Figure 3A:
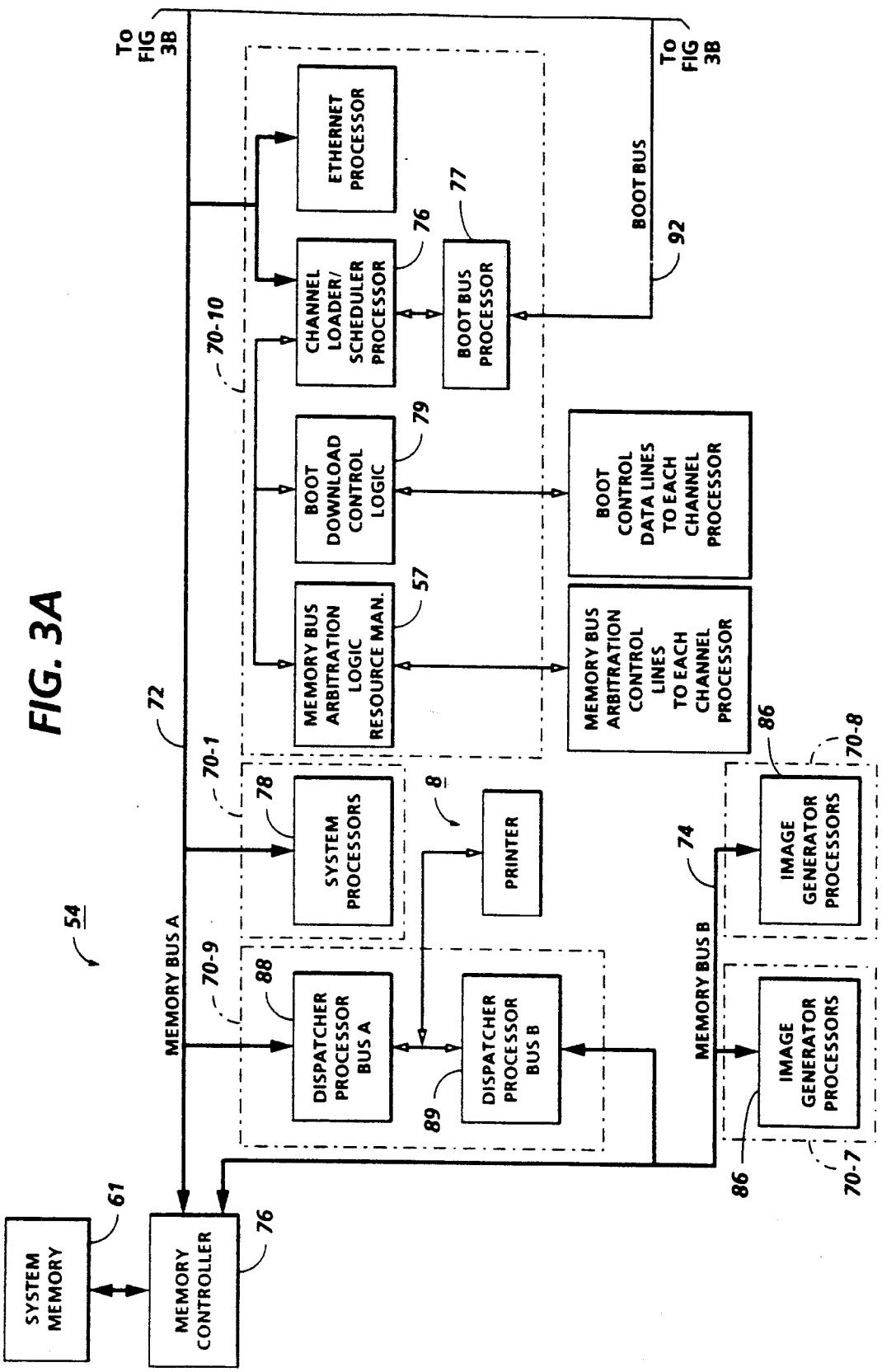
Figure 3B:
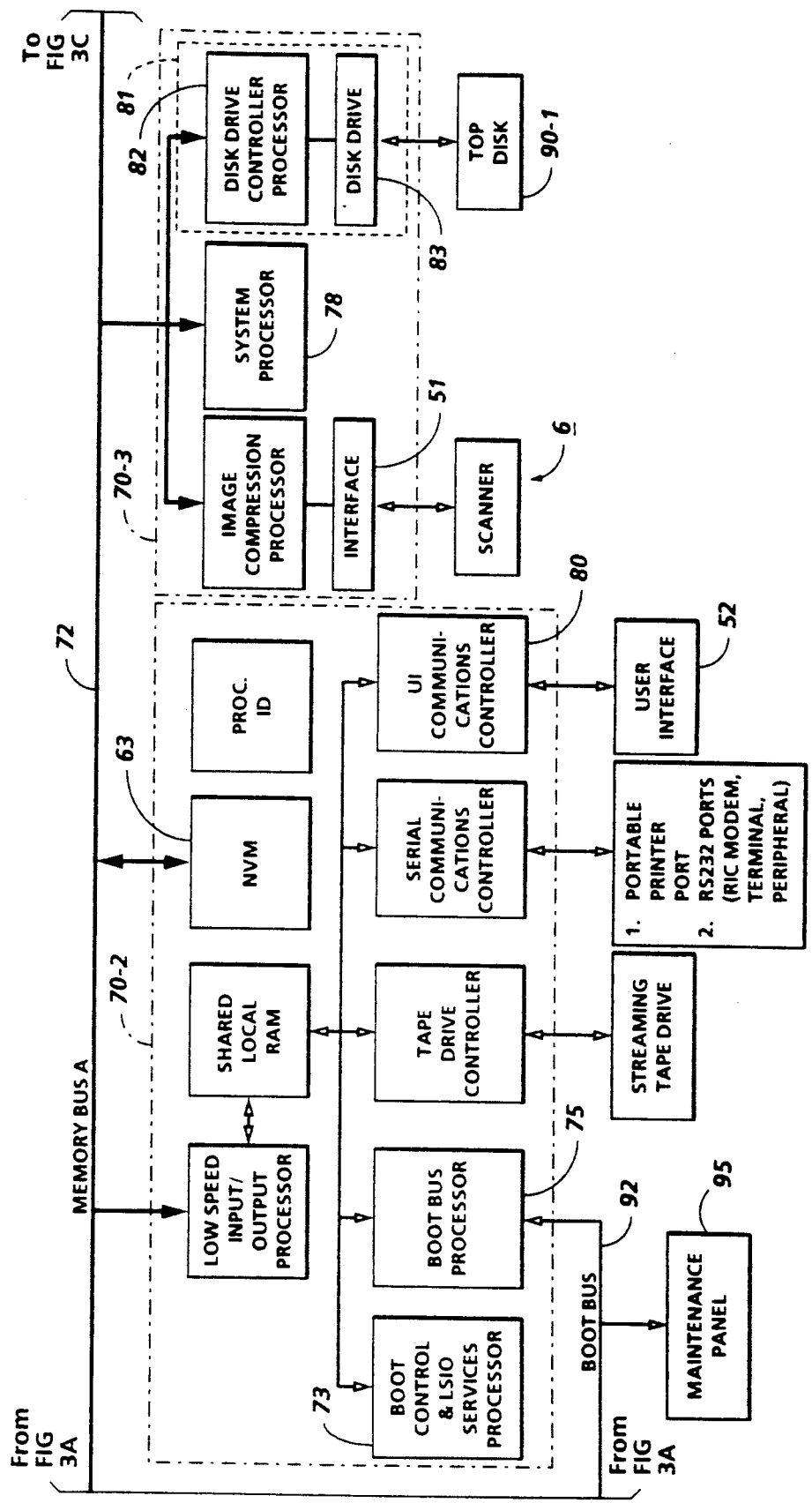
Figure 3C:
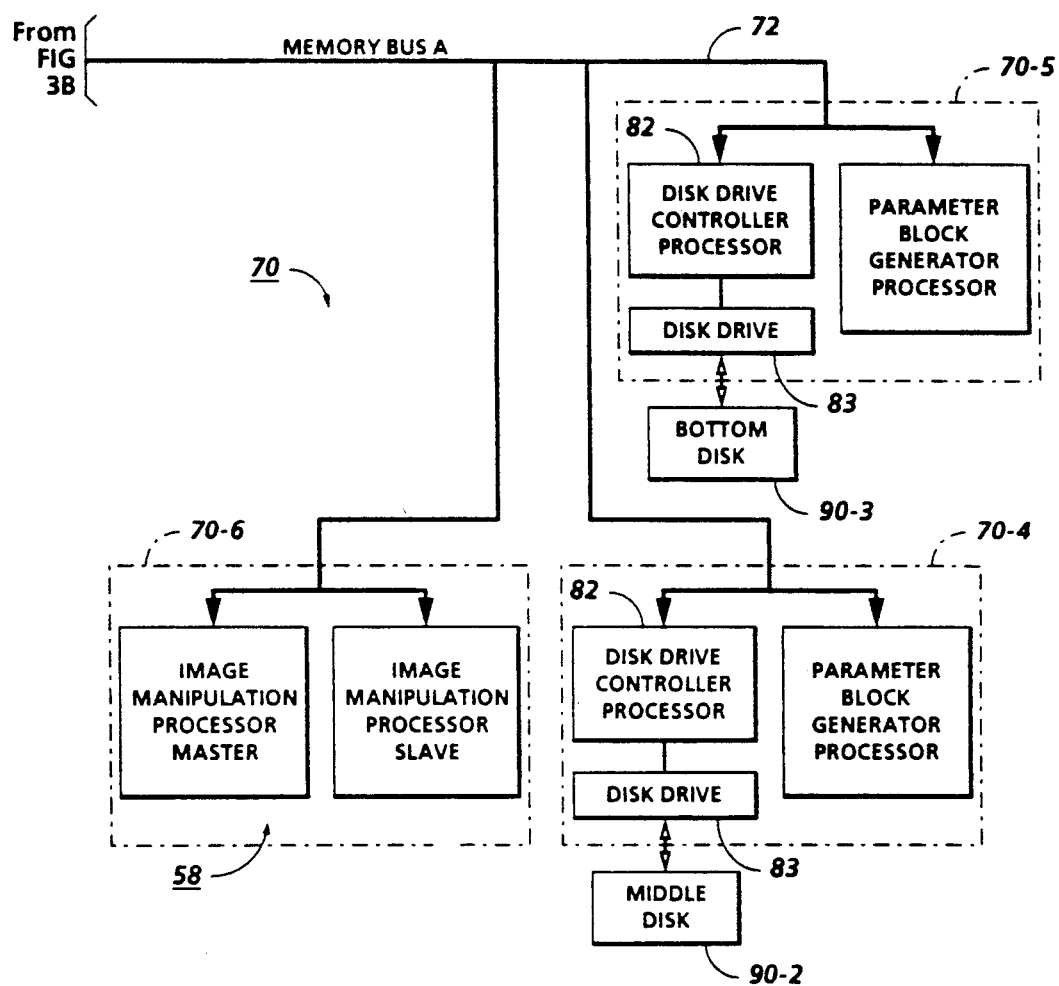
Figure 6:
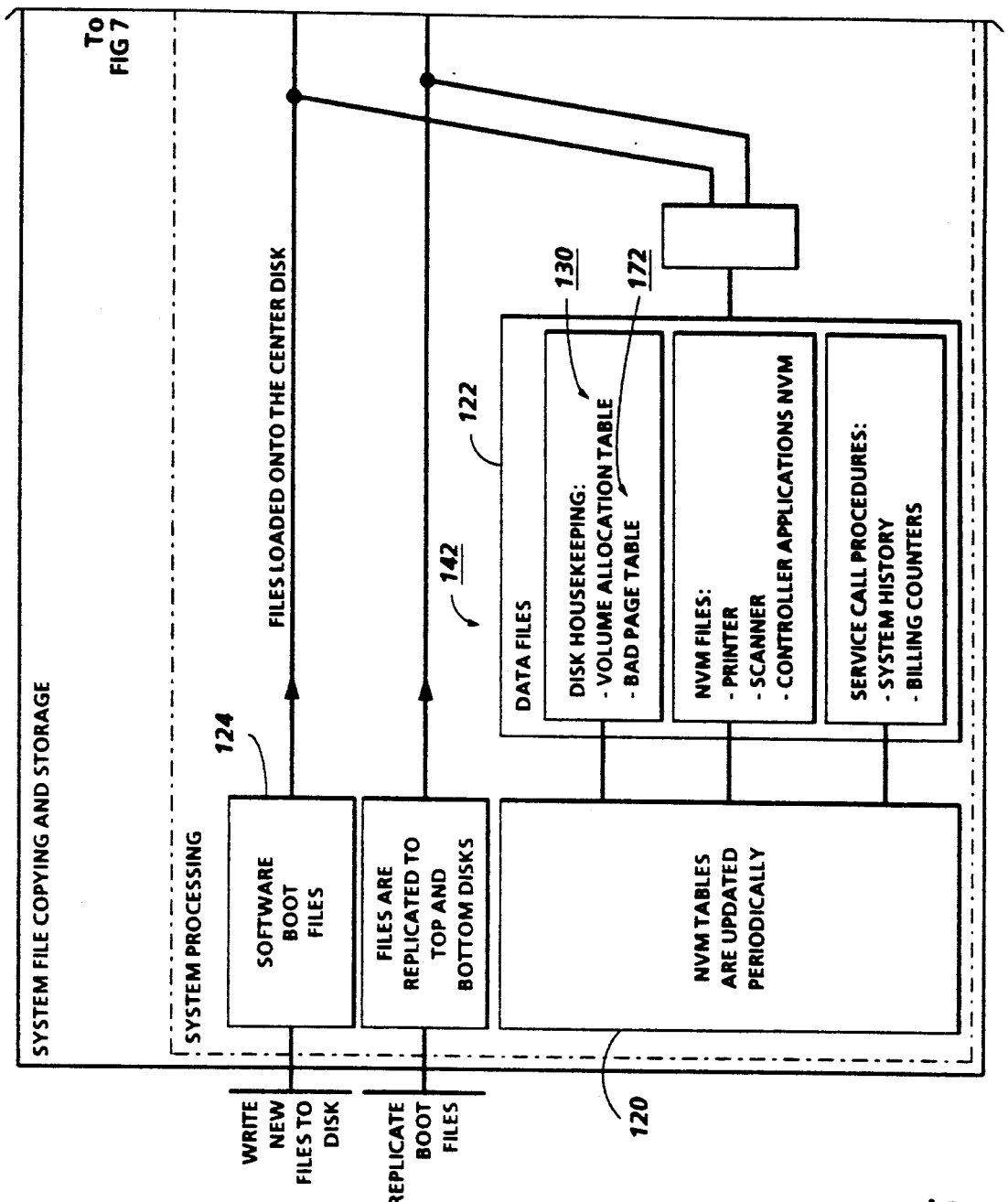
Figure 7:
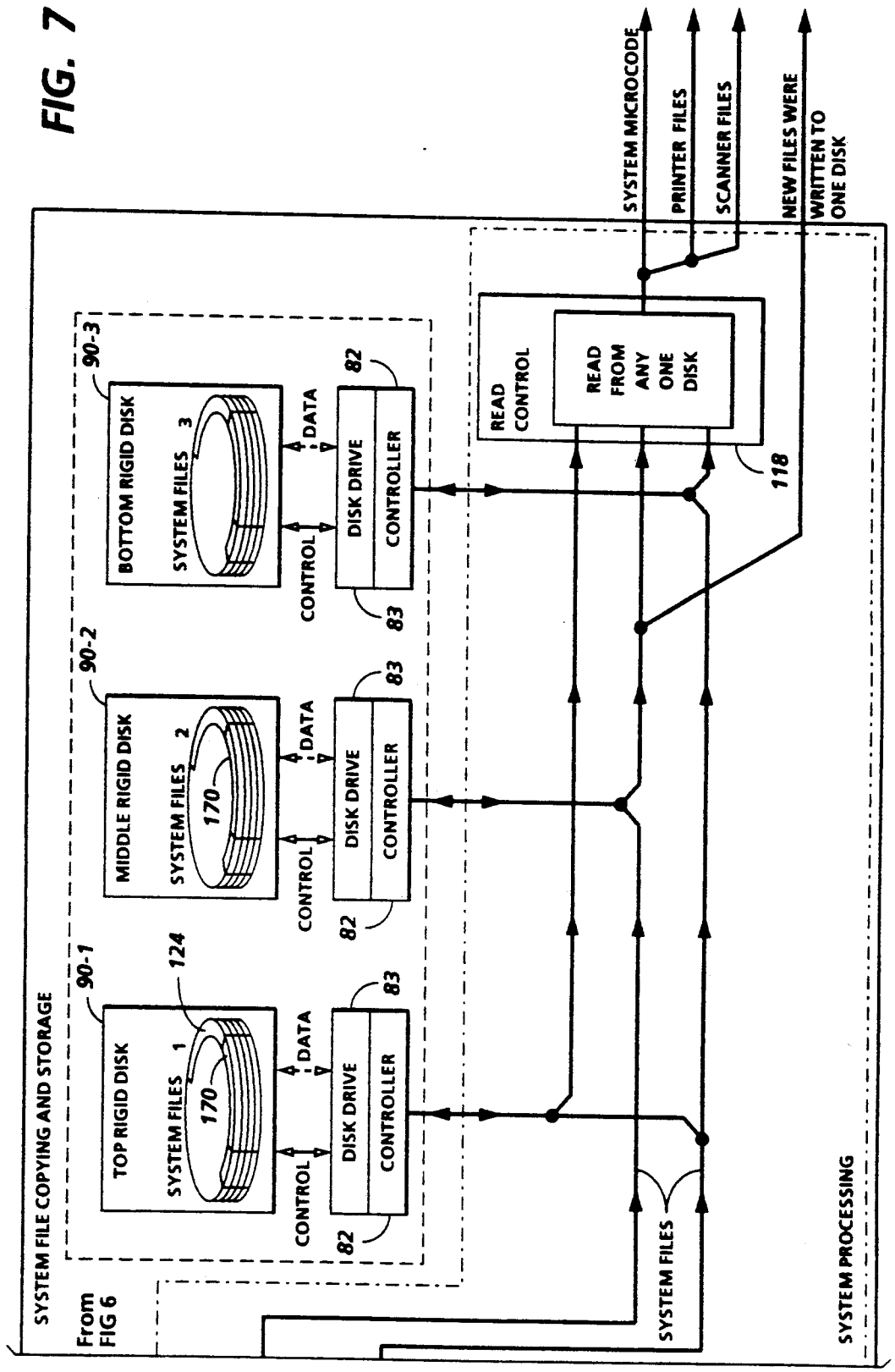
Figure 8:
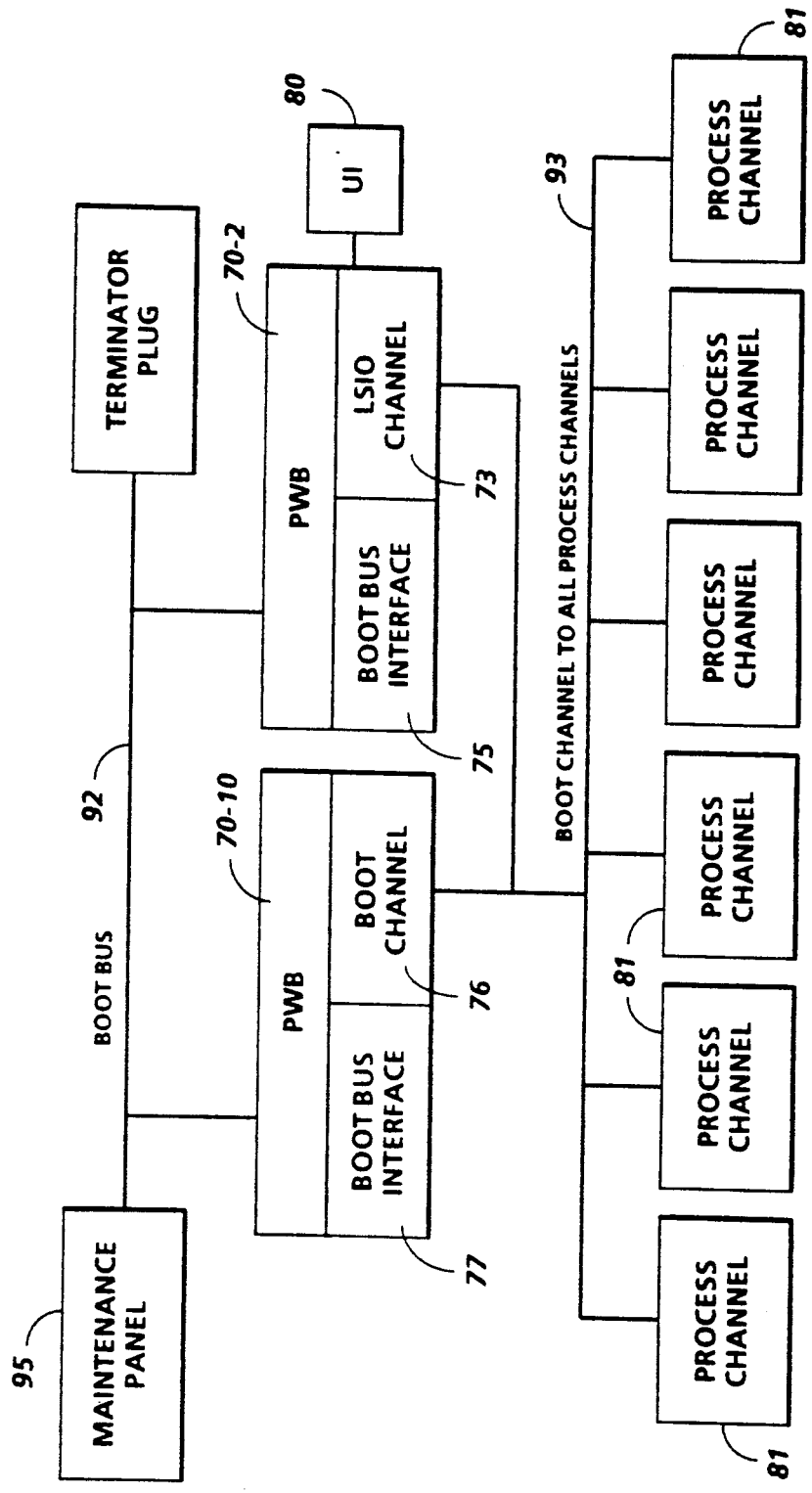
Figure 9:
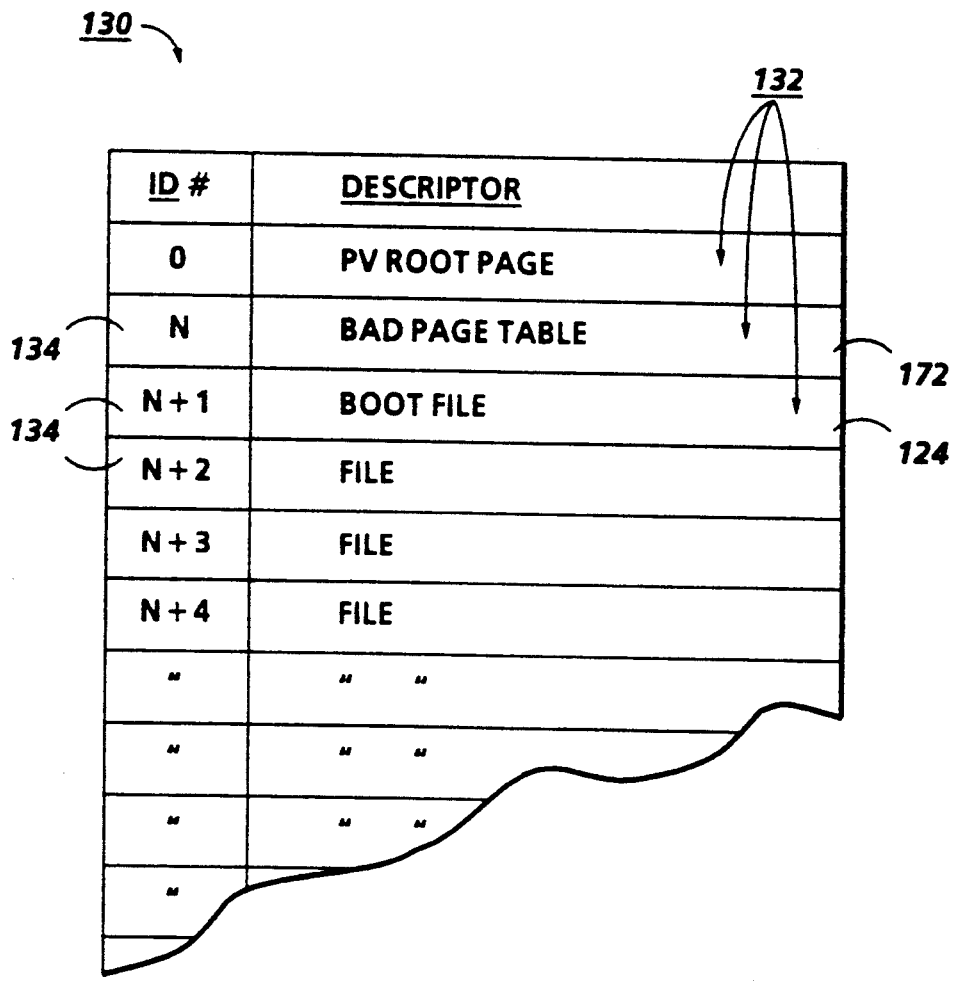
Figure 10:
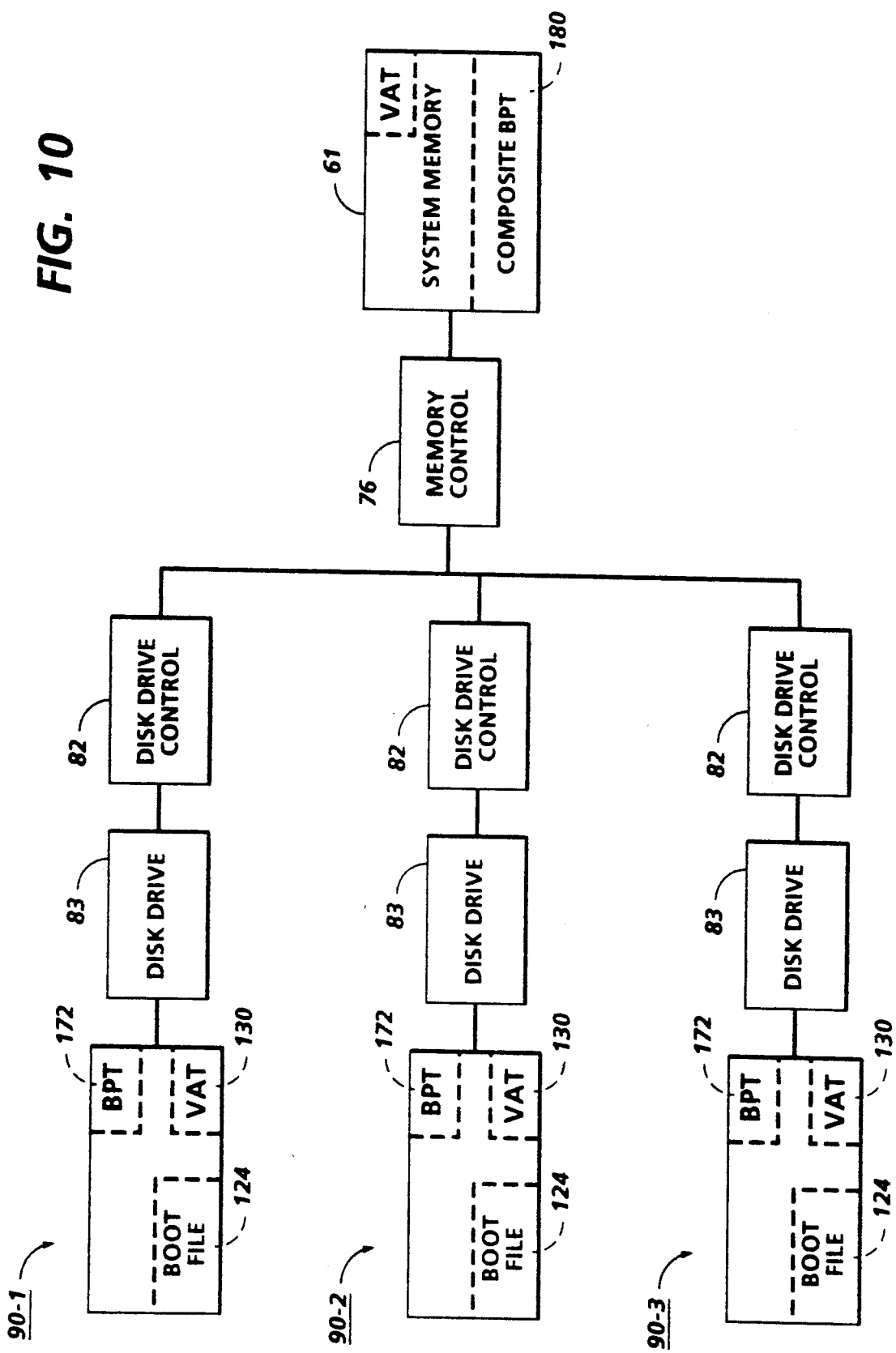

FIGS. 3A, 3B, and 3C comprise a schematic block diagram showing the major parts of the control section for the printing system shown in FIG. 1;

FIG. 4 is a schematic view depicting disk tracks of three disks that comprise the storage media of the printing system shown in FIG. 1 showing the manner in which image files and system files are stored on the disks with bad pages avoided;

FIG. 5 is a block diagram depicting the process for storing image files on disks to provide super disk files;

FIG. 6 is a block diagram depicting the process for collecting system files for storage on disks;

FIG. 7 is a block diagram depicting the process for replicating system files collected from FIG. 6 on disks;

FIG. 8 is a block diagram showing the boot system for booting the printing system depicted in FIG. 1 to an operating state;

FIG. 9 is a schematic view depicting a Volume Allocation Table or VAT;

FIG. 10 is a block diagram showing the relationship between the disk storage media and system memory.

Figure 11:
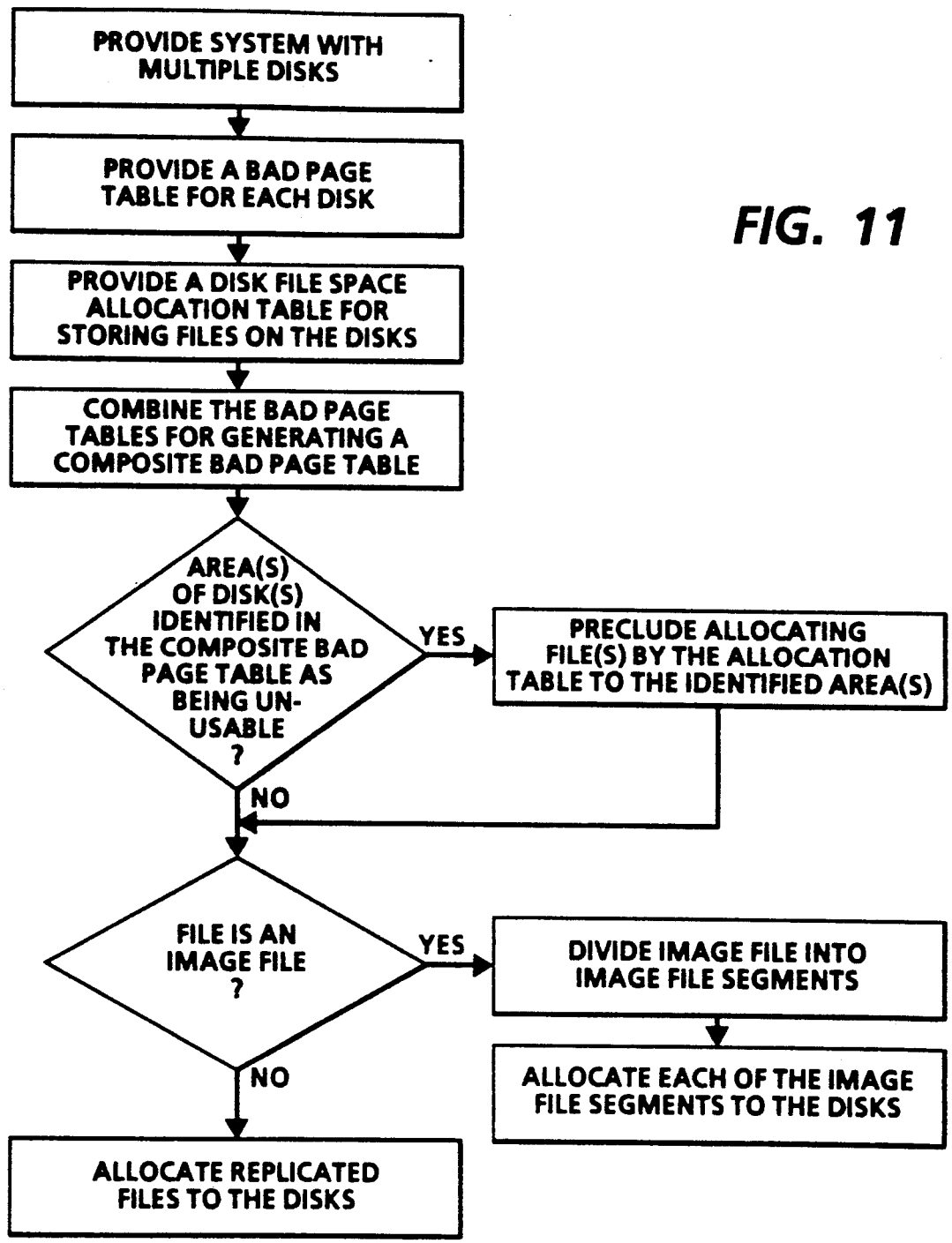

FIG. 11 is a flow diagram illustrating selected steps of a disclosed embodiment.

Figure 2:
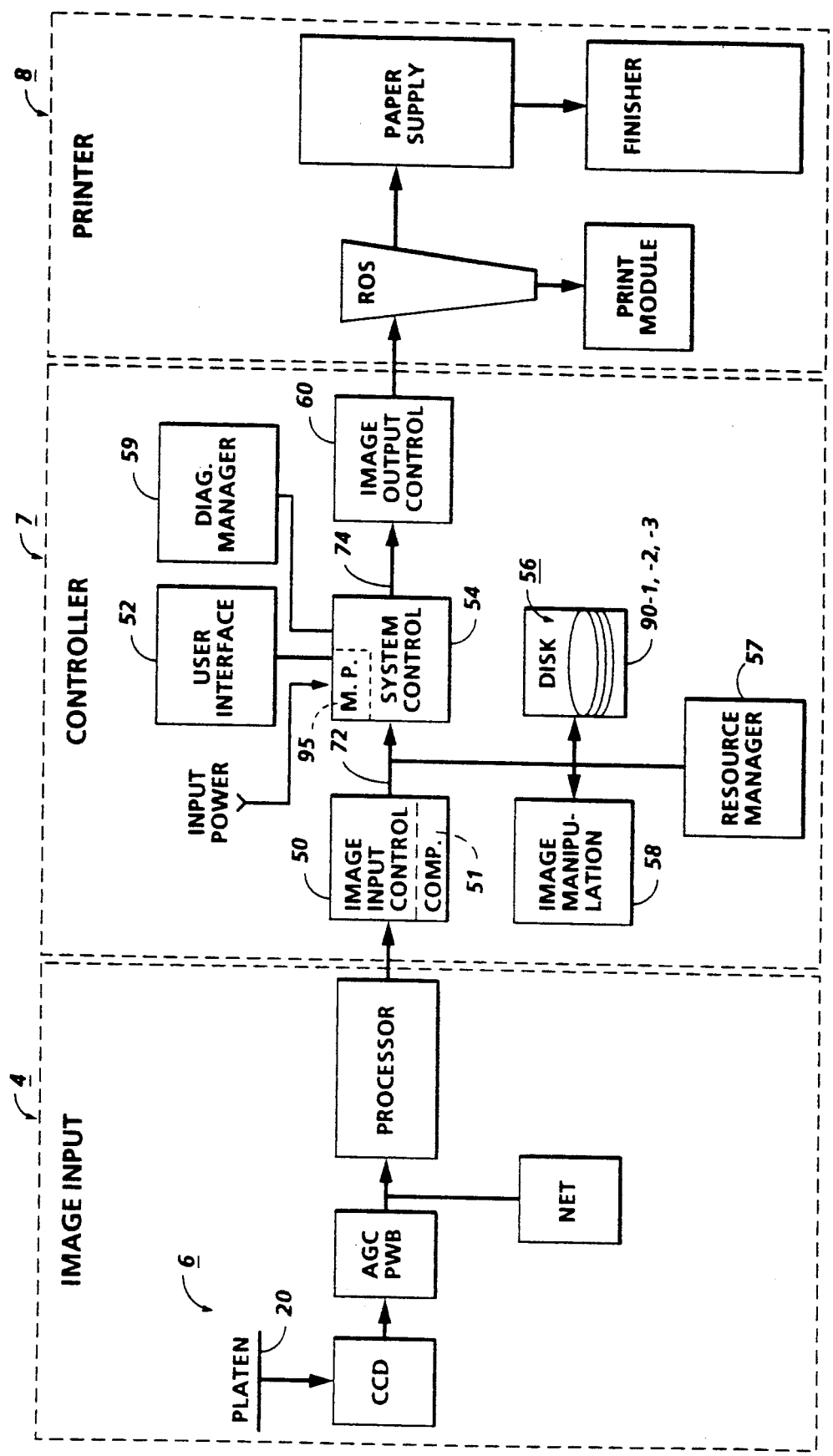
FIG. 2 is a block diagram depicting the major control system elements of the printing system shown in FIG. 1.

Referring to drawings where like reference numerals designate identical or corresponding parts throughout the several views, and more particularly to FIGS. 1 and 2, there is shown an exemplary image printing system 2 for processing print jobs in accordance with the teachings of the present invention. Printing system 2 for purposes of explanation is divided into image input section 4, controller section 7, and printer section 8. In the example shown, image input section 4 has both remote and on-site image inputs, enabling system 2 to provide network, scan, and print services. Other system combinations may be envisioned such as a stand alone printing system with on-site image input (i.e., a scanner), controller, and printer; a network printing system with remote input, controller, and printer; etc.

While a specific printing system is shown and described, the present invention may be used with other types of printing systems. For example, printer section 8 may instead use a different printer type such as ink jet, ionographic, thermal, photographic, etc., and furthermore may be incorporated in electronic display systems, such as CRTs, LCDs, LEDs, etc., or else other image scanning/processing/recording systems, or else other signal transmitting/receiving, recording systems, etc., as well.

A more detailed description of printing system 2 may be found in copending U.S. patent application Ser. No. 07/620,519, filed Nov. 30, 1990, to James R. Graves et al, and entitled "System for Scanning Signature Pages", the disclosure of which is incorporated by reference herein.

Referring to FIG. 2, controller section 7 is, for explanation purposes, divided into an image input controller 50, User Interface (UI) 52, system controller 54, disk memory 56, image manipulation section 58, Resource Manager 57, Diagnostic Manager 59, and image output controller 60.

As best seen in FIG. 1, UI 52 includes a combined operator controller/CRT display consisting of an interactive touchscreen 62, keyboard 64, and mouse 66. UI 52 interfaces the operator with printing system 2, enabling the operator to program print jobs and other instructions, to obtain system operating information, visual document facsimile display, programming information and icons, diagnostic information and pictorial views, etc. Items displayed on touchscreen 62 such as files and icons are actuated by either touching the displayed item on screen 62 with a finger or by using mouse 66 to point cursor 67 to the item selected and keying the mouse.

Referring to FIGS. 2 and 3A-3C, the scanned image data input from scanner section 6 to controller section 7 is compressed by image compressor/processor 51 of image input controller 50 on PWB 70-3. The compressed image data with related image descriptors are placed in image files and temporarily stored in system memory 61 pending transfer to external memory 56 where the data is held pending use.

When the compressed image data in memory 56 requires further processing, or is required for display on touchscreen 62 of UI 52, or is required by printer section 8, the data is accessed in memory 56 and transferred to system memory 61. Where further processing other than that provided by processor 25 is required, the data is transferred to image manipulation section 58 on PWB 70-6 where additional processing steps such as collation, make ready (document editing), decomposition, rotation, etc., are carried out. Following processing, the data may be returned to external memory 56, sent to UI 52 for display on touchscreen 62, or sent to image output controller 60.

Resource Manager 57 controls storage of files while diagnostic manager 59 handles system faults.

Image data output to image output controller 60 is decompressed and readied for printing and output to printer section 8. Image data sent to printer section 8 for printing is normally purged from memory 56 to make room for new image data.

As shown in FIGS. 3A-3C, controller section 7 includes a plurality of Printed Wiring Boards (PWBs) 70, PWBs 70 being coupled with one another and with System Memory 61 by a pair of memory buses 72, 74. Memory controller 76 couples System Memory 61 with buses 72, 74. PWBs 70 include system processor PWB 70-1 having plural application or system processors 78; low speed I/O processor PWB 70-2 having UI communication controller 80 for transmitting data to and from UI 52, Boot Control & LSIO Services Processor 73, and Boot Bus Processor 75; PWBs 70-3, 70-4, 70-5 having disk drive controller/processors 82 with disk drives 83 for transmitting data to and from disks 90-1, 90-2, 90-3 respectively of external memory 56 (image compressor/processor 51 for compressing the image data and another application processor 78 are on PWB 70-3); image manipulation PWB 70-6 with image manipulation processors of image manipulation section 58; image generation processor PWBs 70-7, 70-8 with image generation processors 86 for processing the image data for printing by printer section 8; dispatch processor PWB 70-9 having dispatch processors 88, 89 for controlling transmission of data to and from printer section 8; and boot control-arbitration-scheduler PWB 70-10 having Channel Loader/Scheduler Processor 76, Boot Bus Processor 77, Boot Download Control Logic 79, and Memory Bus Arbitration Logic/Resource Manager 57. As will appear, Loader/Scheduler Processor 76 has two functions, one as a Boot channel to bring the system to the ready state and the other as a scheduler channel used to decide which channel performs which task and in which sequence the tasks will be performed.

Each independent processor and associated circuitry form a channel 81. Channels 81 (an example is shown in FIG. 3B) are independent processors for handling the applications software, or input/output processors for handling peripheral devices such as disk drives. For example, there are disk channels used to interface disk drives 83 for disks 90-1, 90-2, 90-3, scanner interface channel, printer interface channel, etc.

Memory 56 has plural hard disks 90-1, 90-2, 90-3 on which image files 140 and system files 142 are stored. Image files are typically files of scanned image data while system files comprise system operating files such as boot files, software files, data files, etc.

System memory 61, which comprises a Random Access Memory or RAM, serves as a temporary store for data required during system operations. Memory 61 stores bits of data which can be written to (Data Entered) or read from (Data Used) from the memory. Other data in memory 61 is used for reference and remains loaded as long as power is supplied. Since memory 61 is volatile, that is, all data is lost when power to memory 61 is terminated, Non-Volatile Memory or NVM, which essentially comprise RAM memory with battery backup to supply DC voltage when power is turned off, are provided at several locations in the system as, for example, NVM 63 on Low Speed I/O Processor PWB 70-2 (FIG. 3B). NVM 63 is used to store FILE MANAGEMENT UPDATES AND FILE CONTENT UPDATES.

Copending U.S. patent application Ser. No. 07/590,634, filed Sep. 28, 1990, to George L. Eldridge, and entitled "Method of Operating Disk Drives in Parallel", the disclosure of which is incorporated by reference herein, describes what will be referred to herein as Super Disk. Super Disk allows faster read/write access to files since all disks 90-1, 90-2, 90-3 can be accessed simultaneously. The risk incurred in this type of arrangement, however, is the loss of parts of a file should one or more of the disks fail which effectively results in loss of the entire file.

Referring to FIGS. 4 and 5, to implement Super Disk, image files 140 to be transferred to disks 90-1, 90-2, 90-3 are divided by divider logic 110 into file segments or sectors 150, each sector 150 being a preset number of bytes. The sectors are written in succession to successive disks until all of the sectors that comprise the image file are stored. For example, sector 1 of image file 140 is written to disk 90-1, sector 2 to disk 90-2, sector 3 to disk 90-3, sector 4 to disk 90-1, sector 5 to disk 90-2, and so forth and so on. As a result, one larger storage media or super disk is effectively formed. An image location logic 112 designates the location for each sector on disks 90-1, 90-2, 90-3, with the address of each corresponding block of sectors (i.e., sectors 1, 2, 3; sectors 4, 5, 6, etc.) being the same. Image data sequence logic 114 controls the disk writing sequence, while write/read control logic 116 provides the actual instructions to write or read image data to or from disks 90-1, 90-2, 90-3. Image data read from disks 90-1, 90-2, 90-3 is reconstructed by read control logic 118 which reads the image file sectors back from disks 90-1, 90-2, 90-3 in the same manner as the data was written to disks 90-1, 90-2, 90-3.

Referring to FIGS. 4, 6 and 7, system files 142 are normally permanent files which must be maintained. To assure retention, system files 142 are replicated on each of the disks 90-1, 90-2, 90-3 at the same address. Replicated files are written simultaneously to all three disks 90-1, 90-2, 90-3, with the disk heads in the same position.

System files 142, whether updates 120 of data files 122 that occur periodically during operation and life of the system 2 or new files such as new or upgraded software entered as software boot files 124, are written to center disk 90-2 for example through Disk Drive Control Processor 83 for disk 90-2. The system files are thereafter migrated to top and bottom disks 90-1, 90-3. Read control 118 reads system files 142 from any one of the disks 90-1, 90-2, 90-3.

As a result, both super disk files (i.e., image files 140 that are distributed equally on each disk 90-1, 90-2, 90-3 of the system) and replicated files (i.e., duplicate system files 142 on each disk 90-1, 90-2, 90-3) are created. When super disk files are accessed, all disks 90-1, 90-2, 90-3 are busy retrieving/storing data from/to disks. When a copy of a replicated file is accessed for reading, only one disk is busy. Since reading a file from a single disk takes longer than accessing a super disk file, Channel Loader/Scheduler Processor 76 schedules single disk access to all disks 90-1, 90-2, 90-3 in parallel, allowing the system to retrieve more than one file at a time.

Referring to FIGS. 3A, 3B, 7 and 8 and TABLE I, a boot file 124 is replicated on each of the disks 90-1, 90-2, 90-3 for booting system 2. In order to disk boot system 2, the boot software loads the necessary files from whichever disk 90-1, 90-2, or 90-3 is selected as the boot disk into memory and enables execution of the software. Since the boot file is replicated on all disks 90-1, 90-2, 90-3, any disk can be selected as the boot disk.

As will be understood, it is necessary to boot the system when power is first switched on (Cold Boot initiated) or when necessary during system operation (Warm Boot initiated). For example, a manual 'Boot' button (not shown) is provided for initiating a Warm Boot.

In a Cold Boot, the system processors 78, except for a maintenance panel 95, are in a reset state. On power up, maintenance panel 95 checks to determine if power input is correct, and if so, releases reset lines contained in a Boot Bus 92. Boot Bus 92 is coupled to Boot & LSIO service processor 73 and UI communication controller 80 on PWB 70-2 through boot bus processor 75, and to channel Loader/Scheduler processor 76 on PWB 70-10 through boot bus processor 77. The reset lines release processors 76 and 73 and UI communication controller 80, allowing Boot Bus 92 during the boot sequence to transmit software programs from PWB 70-2 to processor 76 on PWB 70-10 for downloading to each processor channel 81. Once communications are established, Boot Channel 93 initializes all channels 81 to enable downloading of the micro code instructions by channel Loader/Scheduler processor 76 as described in TABLE I.

Referring to FIGS. 9 and 10, to keep track of space or volume on disks 90-1, 90-2, 90-3, a file system is used to maintain a record of space allocated to each image and system file 140, 142 on disks 90-1, 90-2, 90-3. For this, the file system maintains a Volume Allocation Table (hereinafter referred to as VAT) 130 for each logical disk volume of the type described in copending U.S. patent application Ser. No. 07/678,921, filed Apr. 1, 1991, to Kitty Sathi, and entitled "File Compaction Process for Electronic Printing Systems", the disclosure of which is incorporated by reference herein. VAT 130 keeps a record of available disk space and a list of the file descriptors 132 for every file 140, 142 on that volume. Each file 140, 142 has a unique ID consisting of an index 134 which is offset into VAT 130 and file descriptor 132. File descriptors 132 contain information concerning the physical location of the file on the disk and the physical characteristics of the file. Descriptors 132 may be linked together when a file spans multiple runs of a disk. (A run 174-depicted in FIG. 4- describes the contiguous extents that comprise a file and consists of a start address of the run with respect to the volume, and run length.) There is a common VAT 130 for all three disks 90-1, 90-2, 90-3. A copy of the VAT 130 is stored on each disk.

Referring to FIGS. 4, 7 and 10, disks such as disks 90-1, 90-2, 90-3 normally have flawed or bad pages 170 that are defective and hence cannot be used. A bad page table (BPT) 172 having a list of bad pages 170 is provided with each particular disk and stored on the disk at a known location.

As described previously, a common VAT 130 is maintained for disks 90-1, 90-2, 90-3, with replicated system files 142 having a common file address and each block of three sectors 150 similarly having the same file address. As a result, the booting process is made easier since the system does not have to keep separate booting information for each disk in the dedicated area on the disk.

Since the number and location of bad pages 170 will vary from disk to disk, the file system marks the same page 170' as inaccessible on each disk. In the example shown in FIG. 4, a bad page 170 appears on disk 90-1. The corresponding pages 170' on each of the other disks 90-2, 90-3 are also marked bad and therefore are inaccessible. When a system file 142 is allocated, the file system creates a run 174 around the marked areas 170, 170', the run 174 describing the contiguous extents that comprise the marked area of the file. Each run 174 consists of a start address of the run with respect to the disk and the length of the run.

Allocating a system file around the bad page is not a significant performance hit because the disk heads will be positioned on the correct cylinder, so no extra seeks are required. The system software needs an additional operation to chain around the bad page. The microcode is fast enough to switch and start another operation and continue transfer in the time it takes the bad page to pass under the heads so that there will be no skipped revolutions.

In the case of an image file 140, sectors 150 are located so that a bad page 170 on one disk (and the corresponding pages 170' on the other disks) are avoided. This avoids the need to break up individual sectors 150.

A composite bad page table 180 that contains a composite of the bad pages identified in the bad page tables 172 associated with each disk 90-1, 90-2, 90-3 is built in memory 61 on each boot. Table 180 cannot be made permanent since the table contents change whenever a disk is replaced. The pages in the composite bad page table 180 are marked as inaccessible in VAT 130 to guarantee that a file is created around them. If a bad page 170 is detected after a file has been allocated, the file is moved to a new location and the new address recorded in VAT 130.

While the invention has been described with reference to the structure disclosed, it is not confined to the details set forth, but is intended to cover such modifications or changes as may come within the scope of the following claims.

TABLE I

BOOT SEQUENCE CONTROL-NORMAL BOOT

1. POWER & CABLE CONNECTIONS ARE CHECKED BOTH TO SCANNER 4 & PRINTER 8
2. SYSTEM MEMORY 61 TESTED & INITIALIZED. CHANNEL PROCESSORS 81 PERFORM READS & WRITES TO VARIOUS SECTIONS OF MEMORY 61
3. DISK CONTROLLER MICROCODE IS DOWNLOADED TO DISK CONTROLLER PROCESSORS 82 VIA BOOT BUS 92 & BOOT DOWNLOAD CONTROL LOGIC 79
4. IF COLD BOOT, SPIN-UP COMMANDS SENT TO DISK DRIVES 83 (IF WARM BOOT, CHECKS MADE TO SEE IF ALL DISKS 90-1, 90-2, 90-3 ARE SPINNING)
5. CHANNEL LOADER MICROCODE IS SENT VIA BOOT BUS 92 TO PWB 70-10. MICROCODE IS THEN DOWNLOADED USING BOOT DOWNLOAD CONTROL LOGIC 79 TO CHANNEL LOADER/SCHEDULER PROCESSOR 76.
6. CHANNEL LOADER/SCHEDULER PROCESSOR 76 REQUESTS THAT DISK CONTROLLER PROCESSOR 82 RETRIEVE THE CONTROLLER MICROCODE FILE FROM DISK 90-2. DISK CONTROLLER PROCESSOR 82 SHIPS FILE TO MEMORY 61. CHANNEL LOADER/SCHEDULER PROCESSOR 76 THEN DOWNLOADS MICROCODE TO EACH CHANNEL 81 USING BOOT DOWNLOAD CONTROL LOGIC.
7. CHANNEL LOADER/SCHEDULER PROCESSOR 76 REQUESTS THAT DISK CONTROLLER PROCESSOR 83 RETRIEVE THE APPLICATION SOFTWARE LOADER PROGRAM FROM DISK 90-2. DISK CONTROLLER PROCESSOR 83 SHIPS FILE TO MEMORY 61.
8. SCHEDULER MICROCODE IS DOWNLOADED INTO CHANNEL LOADER/SCHEDULER PROCESSOR 76. PROCESSOR 76 WILL NOW PERFORM ONLY AS A SCHEDULER PROCESSOR.
9. APPLICATION SOFTWARE LOADER PROGRAM IS STARTED. APPLICATION SOFTWARE IS RETRIEVED FROM DISK 90-2 & STORED IN MEMORY 61.
10. UI 52, SCANNER 4, & PRINTER 8 SOFTWARE IS DOWNLOADED.

We claim:

1. A process for storing files of an electronic printing system for use in operating said printing system following booting of said printing system to an operating state, said system having multiple disks for storing said files, said files including system files replicated on each of said disks and image files that are divided into image file segments with each image file segment stored on a different one of said disks, each of said disks having a bad page table identifying unusable areas of the disk, comprising the steps of:
   a) providing an allocation table for controlling allocation of disk file space for storing said files on said disks;
   b) combining the bad page table for each of said disks to generate a composite bad page table in which for each bad page on one disk, the same page on each other disk of said multiple disks is also identified as an unusable area; and
   c) precluding allocating said files by said allocation table to areas of said disks identified in said composite bad page table as being unusable.

2. The process according to claim 1 including the step of:
   generating said composite bad page table in response to booting said printing system to said operating state to provide an updated composite bad page table.

3. The process according to claim 1 including the step of:
   allocating each of said replicated files to the same address on each of said disks.

4. The process according to claim 1 including the steps of:
   dividing each of said image files into said image file segments with the number of said image file segments being evenly divisible by the number of said disks;
   arranging said image file segments into at least one block having plural image file segments equal to the number of said disks;
   storing each of said image file segments in each block on a different one of said disks; and
   allocating each of said image file segments in each of said blocks to the same address.

5. A process for accommodating bad pages in an electronic printing system having N disks for storing operating files wherein some of the files comprise system files replicated on said disks while others of said files comprise image files divided into image file sectors with said image file sectors divided into blocks of N image file sectors, each image file sector in each of said blocks being stored on a different one of said disks, comprising the steps of:
   a) providing a bad page table with each of said disks identifying the location of bad pages on the disk;
   b) merging said bad page tables to provide a composite bad page table for all of said disks;
   c) providing an allocation table for allocating space on said disks for storing said system files and said image file sectors; and,
   d) preventing allocation of said system files and said image file sectors to the bad pages identified in said composite bad page table when allocating space on said disks for storing said system files and said image file sectors.

6. The process according to claim 5 including the steps of:
   booting said printing system to an operating state in response to a demand for prints; and
   generating a new composite bad page table in response to booting said system.

7. A process for accommodating bad pages in an electronic printing system memory having N disks in which files stored on said disks comprise replicated files stored at the same address on each of said disks and non-replicated files, each non-replicated file being divided into a plurality of relatively small sectors of equal size with the number of said sectors being evenly divisible by the number of said disks, every N ones of said sectors forming a sector block, each sector block having one sector therein stored on a different one of said disks with the disk address of each sector in each block being the same, comprising the steps of:
  a) providing a list of bad pages for each of said disks;
  b) providing a common volume allocation table for use in allocating areas on said disks for storing replicated and non-replicated files;
  c) generating a composite bad page table in said volume allocation table combining the bad pages for all of said disks from said lists and marking the same page bad on all of said disks; and
  d) using said allocation table, allocating areas on said disks for said replicated and non-replicated files while excluding disk areas identified in said composite bad page table.

8. The process according to claim 7 including the steps of:
  booting said printing system to an operating state in response to a demand for prints; and
  generating an updated composite bad page table for use by said volume allocation table in response to booting of said printing system.

9. A process for accommodating bad pages in a multiple disk memory of an electronic printing system when storing system files, said system files including first files replicated on each of said disks to safeguard against loss and second files, each of said second files being divided into a series of relatively small file sectors such that the number of said file sectors is evenly divisible by the number of said disks, said file sectors being segregated into blocks, each of said blocks being comprised of a number of file sectors equal to the number of said disks, comprising the steps of:
  a) for each of said disks, providing a bad page table identifying the location of each bad page on the disk;
  b) merging said bad page tables to provide a single composite bad page table for all of said disks;
  c) providing a common allocation table for allocating space on said disks for said first and second files; and
  d) preventing allocation of said files to disk space on disks identified in said composite bad page table as a bad page or to the same disk space on any other disk in said multiple disk memory.

10. The process according to claim 9 including the steps of:
  booting said printing system to an operating state in response to a demand for prints; and
  updating said composite bad page table by merging said bad page tables for each of said disks in said printing system in response to booting of said printing system.

* * * * *